July 22, 1969 TAKASI OKADA ET AL 3,457,473

SEMICONDUCTOR DEVICE WITH SCHOTTKY BARRIER FORMED ON (100) PLANE OF GaAs

Filed Nov. 8, 1966

INVENTORS
TAKASI OKADA
MASARU NAKAMURA
BY
Hopgood & Calimafde
ATTORNEYS.

United States Patent Office 3,457,473

Patented July 22, 1969

3,457,473

SEMICONDUCTOR DEVICE WITH SCHOTTKY BARRIER FORMED ON (100) PLANE OF GaAs

Takasi Okada and Masaru Nakamura, Tokyo, Japan, assignors to Nippon Electric Company, Limited, Tokyo, Japan, a corporation of Japan Filed Nov. 8, 1966, Ser. No. 592,783
Claims priority, application Japan, Nov. 10, 1965, 40/69,013
Int. Cl. H01l 3/00, 5/06
U.S. Cl. 317—234 3 Claims

ABSTRACT OF THE DISCLOSURE

A gallium arsenide single crystal has formed thereon a chemically clean main surface in parallel with the (100) plane of the crystal. A metal film is formed on a surface to produce a Schottky barrier and a pair of electrodes attached to form the semiconductor device. The metal film is selected from the group consisting of gold, molybdenum and tungsten.

The present invention relates generally to compound semi-conductor devices and, more particularly, to gallium arsenide semi-conductor devices employing Schottky barriers.

As used herein, a Schottky barrier means, in general, a barrier formed at the interface of a chemically clean semi-conductor surface and a metal surface. The Schottky barrier may be said to be essentially superior in its high-frequency response to a conventional p-n junction, because in the rectification characteristic of a Schottky barrier device, the majority carrier alone participates in the rectification property while in the conventional p-n junction, both the majority carrier as well as the minority carrier participitate in the rectification property.

The special merit of Schottky barriers can be maximally displayed in the preparation of barrier type diodes for example, by selecting, from among various semi-conductor materials, gallium arsenide (GaAs) which has a large value of the electron mobility. This special merit of GaAs Schottky barriers is considerably offset by the phenomenon that their forward current densities at low forward bias voltages may be considerably smaller than those of Ge or Si Schottky barriers.

One of the objects of this invention is to provide a suitable solution for this difficulty which GaAs Schottky barrier diodes have encountered.

Now GaAs crystals belong essentially to the zinc-blende-type crystal system. Thus, the low index crystal faces are present, for example, in the (100), (110), Ga (111), and As $(\overline{111})$ orientations.

With compound semi-conductor crystals, as has been publicly known, the physical or chemical properties of the crystal faces are varied more or less with the crystal face orientations. GaAs crystals are no exception to this rule.

The Schottky barrier behaviors have been studied by many researchers mainly of the (110), Ga (111), and As $(\overline{111})$ planes and it is a well established fact that the maximum current density at low forward bias is available with the (110) plane selected as a barrier. Even so, the ratio of the forward current density, for example, of an Au-n-type GaAs Schottky barrier diode using the (110) plane to that of an Au-n-type Si Schottky barrier diode using the (110) plane remains as small as about $\frac{1}{200}$. This fact has impeded the former diodes from being applied as switching diodes for which rapid forward current rising characteristics are required.

A principal object of this invention is to provide semi-conductor devices employing GaAs Schottky barriers having large current densities at low forward bias voltages.

This object can be realized, as will be detailed, by selecting the (100) plane of GaAs crystals as a barrier plane.

It has been reported in several treatises that the height of a GaAs Schottky barrier formed on the (110) substrate with gold evaporated thereon as a metallic layer is 0.9 ev., whereas the corresponding height of a similar GaAs Schottky barrier formed on the (100) substrate was 0.8 ev., according to our experiments.

As will be evident from the diode theory, the forward current density decreases exponentially with increasing barrier height. Therefore, it can be well anticipated that a small difference in the barrier height may give rise to a large difference in the forward current density.

As a matter of fact, according to our experimental verifications, the current densities at low forward bias of Schottky barriers formed on GaAs substrates having low index crystal faces became smaller in the order of the following orientations:

$$(100)>(110)>\text{Ga }(111)>\text{As }(\overline{111})$$

The current density of a Schottky barrier formed on the (100) orientation was some 50 times as large as that of a barrier formed on the (110) orientation which had generally been considered to be the maximum.

This invention will be better understood from the following description when read in connection with the accompanying drawing in which.

Figure 1:
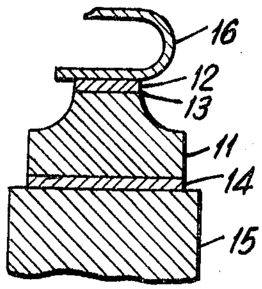
FIG. 1 is a simplified diagram illustrating a view, in section, of the essential parts of a Schottky barrier diode structure constructed according to this invention. For reasons of clarity, FIG. 1 does not portray the actual proportion of the parts of the structure.

Referring to FIG. 1, there is illustrated diagrammatically a view, in cross section, of the principal parts of one form of a Schottky barrier diode fabricated according to this invention. In FIG. 1:

11 denotes a GaAs pellet of the n-$n^+$ epitaxial structure; said structure may be arranged to have any or all of the substrate orientations: Ga (111), As $(\overline{111})$, (110) and (100); but especially the (100) orientation;

12 denotes an evaporated film, for example, of gold, formed on the surface of the epitaxial layer of the pellet 11 or at the top of a mesa structure;

13 denotes a Schottky barrier; that is, the Schottky barrier between the film 12 and the surface of the epitaxial layer of pellet 11;

14 denotes a lower electrode constituting an ohmic contact with the bottom surface of the pellet 11;

15 denotes a pedestal for mounting this semiconductor device structure, said ohmic contact 14 being preferably soldered to the pedestal surface; and

16 denotes an upper electrode provided with the usual spring action to furnish a predetermined tension upon the evaporated film surface 12 for the purpose of securing good electrical continuity therewith.

The remainder of the semi-conductor device structure will be apparent to those skilled in the art.

Now our experimental results indicating a comparison between the forward characteristics of the Schottky barrier diodes which were fabricated so as to be the same in their geometrical configurations (as illustrated in FIG. 1) and differing in the respective substrate orientations, will now be outlined.

Figure 2:
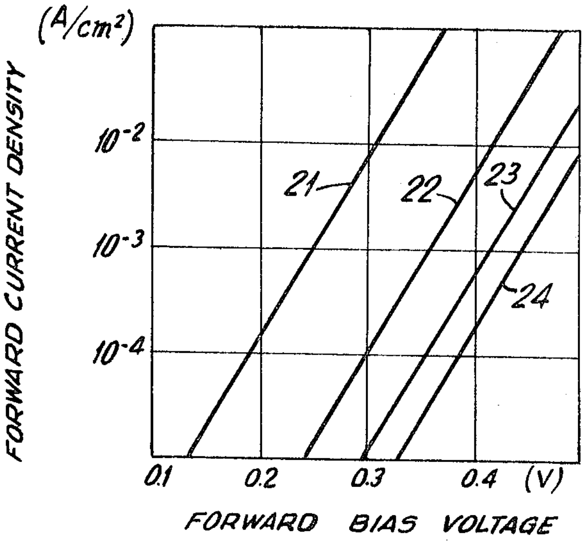
FIG. 2 illustrates several curves showing the forward current density vs. forward bias voltage characteristics of various Schottky barrier diodes with different GaAs substrate orientations, the diodes employing substantially the same structure as illustrated in FIG. 1 to demonstrate the merit of this invention.

FIG. 2 illustrates a plot or plots of the forward characteristics for the four different substrate orientations.

The forward current density and the forward bias voltage have been plotted, respectively, as the ordinates and the abscissae.

The curves 21, 22, 23, and 24 correspond, respectively, to the respective (100), (110), Ga (111), and As $(\overline{111})$ substrate orientations.

The outstanding merit of this invention is readily evident from the results shown by the respective curves for the four different Schottky barrier diodes using above-noted substrate orientations. The forward current density is clearly the largest of all for the (100) substrate orientation (at any selected forward bias voltage), being some 50 times as large as (or larger than) that of the (110) substrate orientation (or the other substrate orientations).

It may be said, therefore, application of this invention enables the forward current densities of Schottky barrier diodes to be improved by some or more fifty times.

For instance, it was confirmed by our experiment that Schottky barriers with similar electrical properties can also be realized by evaporating molybdenum or tungsten onto GaAs substrates, at 12 of FIG. 1, in lieu of gold.

While the principles of this invention have been described above in connection with a specific embodiment of this invention in which Schottky barriers are formed by evaporating gold onto particular GaAs substrates employing the (100) plane orientation of GaAs single crystals as the Schottky barrier, it will be obvious to those skilled in the art that various changes may be made in the geometrical configuration of FIG. 1 or in the materials composing the semi-conductor device without substantially departing from the spirit of this invention and the scope of the appended claims.

We claim:

1. A semiconductor device comprising:

a gallium arsenide single crystal having a chemically clean main surface lying substantially parallel with the (100) plane of said crystal;

a metal film formed on said main surface to form a Schottky barrier therebetween;

an electrode attached in ohmic contact with said crystal at its surface excluding that portion covered by said metal film; and another electrode electrically connected to said metal film whereby application of a given voltage across said electrodes brings about a forward current density substantially higher than that producible by said device with said main surface oriented not in parallel with said (100) plane.

2. A semiconductor device as claimed in claim 1, wherein said metal film is formed of a material selected from the group consisting of gold, molybdenum, and tungsten.

3. A semiconductor device as claimed in claim 1, wherein said other electrode is a leaf-spring pressing itself against said metal film.

References Cited

UNITED STATES PATENTS

| | | | |
|---|---|---|---|
| 3,271,636 | 9/1966 | Irvin | 317—234 |
| 3,257,626 | 6/1966 | Marinace | 331—94.5 |
| 3,121,809 | 2/1964 | Atalla | 307—88.5 |
| 3,349,297 | 10/1967 | Crowell | 317—234 |
| 3,360,851 | 2/1968 | Kahng | 29—590 |

JOHN W. HUCKERT, Primary Examiner

M. H. EDLOW, Assistant Examiner

U.S. Cl. X.R.

317—235